United States Patent
Giesbrecht et al.

(10) Patent No.: US 7,680,652 B2
(45) Date of Patent: *Mar. 16, 2010

(54) PERIODIC SIGNAL ENHANCEMENT SYSTEM

(75) Inventors: David Giesbrecht, Vancouver (CA); Phillip Hetherington, Port Moody (CA)

(73) Assignee: QNX Software Systems (Wavemakers), Inc., Vancouver, British Columbia (CA)

( * ) Notice: Subject to any disclaimer, the term of this patent is extended or adjusted under 35 U.S.C. 154(b) by 1527 days.

This patent is subject to a terminal disclaimer.

(21) Appl. No.: 10/973,575

(22) Filed: Oct. 26, 2004

(65) Prior Publication Data

US 2006/0089958 A1  Apr. 27, 2006

(51) Int. Cl.
*G10L 21/02* (2006.01)
(52) U.S. Cl. .................. 704/226; 704/206; 704/231; 704/233; 704/268; 704/E19.045
(58) Field of Classification Search .............. 704/226, 704/267, 26, 231, 233, 206, E19.045, 268
See application file for complete search history.

(56) References Cited

U.S. PATENT DOCUMENTS

| | | | |
|---|---|---|---|
| 4,238,746 A * | 12/1980 | McCool et al. ............ 333/166 |
| 4,282,405 A | 8/1981 | Taguchi | |
| 4,486,900 A | 12/1984 | Cox et al. | |
| 4,531,228 A | 7/1985 | Noso et al. | |
| 4,628,156 A | 12/1986 | Irvin | |
| 4,630,305 A | 12/1986 | Borth et al. | |
| 4,791,390 A * | 12/1988 | Harris et al. ............ 333/166 |
| 4,811,404 A | 3/1989 | Vilmur et al. | |
| 4,843,562 A | 6/1989 | Kenyon et al. | |
| 4,939,685 A * | 7/1990 | Feintuch .................... 708/322 |
| 4,969,192 A | 11/1990 | Chen et al. | |
| 5,027,410 A | 6/1991 | Williamson et al. | |
| 5,056,150 A | 10/1991 | Yu et al. | |
| 5,146,539 A | 9/1992 | Doddington et al. | |

(Continued)

FOREIGN PATENT DOCUMENTS

CA    2158847    9/1994

(Continued)

OTHER PUBLICATIONS

Anderson C.M., et al: "Adaptive Enhancement of Finite Bandwidth Signals in White Gaussian Noise", *IEEE Trans. On Acoustics, Speech and Signal Processing*, vol. ASSP-31, No. 1, Feb. 1983, pp. 17-28.

(Continued)

*Primary Examiner*—David R Hudspeth
*Assistant Examiner*—Abdelali Serrou
(74) *Attorney, Agent, or Firm*—Brinks Hofer Gilson & Lione

(57) ABSTRACT

A signal enhancement system improves the understandability of speech or other audio signals. The system reinforces selected parts of the signal, may attenuate selected parts of the signal, and may increase SNR. The system includes delay logic, an adaptive filter, and signal reinforcement logic. The adaptive filter may track one or more fundamental frequencies in the input signal and outputs a filtered signal. The filtered signal may approximately reproduce the input signal approximately delayed by an integer multiple of the signal's fundamental frequencies. The reinforcement logic combines the input signal and the filtered signal output to produce an enhanced signal output.

43 Claims, 6 Drawing Sheets

U.S. PATENT DOCUMENTS

| | | |
|---|---|---|
| 5,278,780 A | 1/1994 | Eguchi et al. |
| 5,313,555 A | 5/1994 | Kamiya |
| 5,377,276 A | 12/1994 | Terai et al. |
| 5,400,409 A | 3/1995 | Linhard |
| 5,406,622 A | 4/1995 | Silverberg et al. |
| 5,412,735 A | 5/1995 | Engebretson et al. |
| 5,432,859 A | 7/1995 | Yang et al. |
| 5,473,702 A | 12/1995 | Yoshida et al. |
| 5,479,517 A | 12/1995 | Linhard |
| 5,494,886 A | 2/1996 | Kehne et al. |
| 5,495,415 A | 2/1996 | Ribbens et al. |
| 5,502,688 A | 3/1996 | Recchione et al. |
| 5,526,466 A | 6/1996 | Takizawa |
| 5,568,559 A | 10/1996 | Makino |
| 5,572,262 A * | 11/1996 | Ghosh ........................ 348/607 |
| 5,584,295 A | 12/1996 | Muller et al. |
| 5,590,241 A | 12/1996 | Park et al. |
| 5,615,298 A | 3/1997 | Chen |
| 5,641,931 A | 6/1997 | Ogai et al. |
| 5,677,987 A | 10/1997 | Seki et al. |
| 5,680,508 A | 10/1997 | Liu |
| 5,692,104 A | 11/1997 | Chow et al. |
| 5,701,344 A | 12/1997 | Wakui |
| 5,714,997 A | 2/1998 | Anderson |
| 5,742,694 A | 4/1998 | Eatwell |
| 5,819,215 A | 10/1998 | Dobson et al. |
| 5,845,243 A | 12/1998 | Smart et al. |
| 5,920,840 A | 7/1999 | Satyamurti et al. |
| 5,920,848 A | 7/1999 | Schutzer et al. |
| 5,933,801 A | 8/1999 | Fink et al. |
| 5,949,886 A | 9/1999 | Nevins et al. |
| 5,949,888 A | 9/1999 | Gupta et al. |
| 5,953,694 A | 9/1999 | Pillekamp |
| 6,011,853 A | 1/2000 | Koski et al. |
| 6,084,907 A | 7/2000 | Nagano et al. |
| 6,111,957 A | 8/2000 | Thomasson |
| 6,144,336 A | 11/2000 | Preston et al. |
| 6,163,608 A | 12/2000 | Romesburg et al. |
| 6,167,375 A | 12/2000 | Miseki et al. |
| 6,173,074 B1 | 1/2001 | Russo |
| 6,175,602 B1 | 1/2001 | Gustafson et al. |
| 6,192,134 B1 | 2/2001 | White et al. |
| 6,199,035 B1 | 3/2001 | Lakaniemi et al. |
| 6,219,418 B1 | 4/2001 | Eriksson et al. |
| 6,249,275 B1 | 6/2001 | Kodama |
| 6,282,430 B1 | 8/2001 | Young |
| 6,405,168 B1 | 6/2002 | Bayya et al. |
| 6,408,273 B1 | 6/2002 | Quagliaro et al. |
| 6,434,246 B1 | 8/2002 | Kates et al. |
| 6,473,409 B1 * | 10/2002 | Malvar ........................ 370/286 |
| 6,493,338 B1 | 12/2002 | Preston et al. |
| 6,507,814 B1 | 1/2003 | Gao |
| 6,587,816 B1 | 7/2003 | Chazen et al. |
| 6,633,894 B1 | 10/2003 | Cole |
| 6,643,619 B1 | 11/2003 | Linhard et al. |
| 6,687,669 B1 | 2/2004 | Schrögmeier et al. |
| 6,690,681 B1 | 2/2004 | Preston et al. |
| 6,725,190 B1 | 4/2004 | Cohen et al. |
| 6,771,629 B1 | 8/2004 | Preston et al. |
| 6,782,363 B2 | 8/2004 | Lee et al. |
| 6,804,640 B1 | 10/2004 | Weintraub et al. |
| 6,822,507 B2 | 11/2004 | Buchele |
| 6,836,761 B1 | 12/2004 | Kawashima et al. |
| 6,859,420 B1 | 2/2005 | Coney et al. |
| 6,871,176 B2 | 3/2005 | Choi et al. |
| 6,891,809 B1 | 5/2005 | Ciccone et al. |
| 6,898,293 B2 * | 5/2005 | Kaulberg ................... 381/318 |
| 6,910,011 B1 | 6/2005 | Zakarauskas |
| 6,937,978 B2 | 8/2005 | Liu |
| 7,020,291 B2 | 3/2006 | Buck et al. |
| 7,117,149 B1 | 10/2006 | Zakarauskas |
| 7,146,012 B1 | 12/2006 | Belt et al. |
| 7,146,316 B2 | 12/2006 | Alves |
| 7,167,516 B1 | 1/2007 | He |
| 7,167,568 B2 | 1/2007 | Malvar et al. |
| 7,206,418 B2 | 4/2007 | Yang et al. |
| 7,231,347 B2 | 6/2007 | Zakarauskas |
| 7,269,188 B2 | 9/2007 | Smith |
| 7,272,566 B2 | 9/2007 | Vinton |
| 2001/0005822 A1 | 6/2001 | Fujii et al. |
| 2001/0028713 A1 | 10/2001 | Walker |
| 2002/0052736 A1 | 5/2002 | Kim et al. |
| 2002/0071573 A1 | 6/2002 | Finn |
| 2002/0176589 A1 | 11/2002 | Buck et al. |
| 2003/0040908 A1 | 2/2003 | Yang et al. |
| 2003/0093265 A1 | 5/2003 | Xu et al. |
| 2003/0093270 A1 | 5/2003 | Domer |
| 2003/0097257 A1* | 5/2003 | Amada et al. ............... 704/208 |
| 2003/0101048 A1 | 5/2003 | Liu |
| 2003/0206640 A1* | 11/2003 | Malvar et al. .................. 381/93 |
| 2003/0216907 A1 | 11/2003 | Thomas |
| 2004/0002856 A1 | 1/2004 | Bhaskar et al. |
| 2004/0024600 A1 | 2/2004 | Hamza et al. |
| 2004/0071284 A1 | 4/2004 | Abutalebi et al. |
| 2004/0078200 A1 | 4/2004 | Alves |
| 2004/0138882 A1 | 7/2004 | Miyazawa |
| 2004/0165736 A1 | 8/2004 | Hetherington et al. |
| 2004/0167777 A1 | 8/2004 | Hetherington et al. |
| 2004/0179610 A1 | 9/2004 | Lu et al. |
| 2005/0075866 A1* | 4/2005 | Widrow ..................... 704/211 |
| 2005/0114128 A1 | 5/2005 | Hetherington et al. |
| 2005/0240401 A1 | 10/2005 | Ebenezer |
| 2006/0034447 A1 | 2/2006 | Alves et al. |
| 2006/0056502 A1 | 3/2006 | Callicotte |
| 2006/0074646 A1 | 4/2006 | Alves et al. |
| 2006/0089959 A1 | 4/2006 | Nongpiur et al. |
| 2006/0100868 A1 | 5/2006 | Hetherington et al. |
| 2006/0115095 A1 | 6/2006 | Giesbrecht et al. |
| 2006/0116873 A1 | 6/2006 | Hetherington et al. |
| 2006/0251268 A1 | 11/2006 | Hetherington et al. |
| 2006/0287859 A1 | 12/2006 | Hetherington et al. |
| 2007/0033031 A1 | 2/2007 | Zakarauskas |
| 2007/0136055 A1 | 6/2007 | Hetherington |

FOREIGN PATENT DOCUMENTS

| | | |
|---|---|---|
| CA | 2157496 | 10/1994 |
| CA | 2158064 | 10/1994 |
| EP | 0 076 687 A1 | 4/1983 |
| EP | 0 275 416 | 7/1988 |
| EP | 0 629 996 A2 | 12/1994 |
| EP | 0 629 996 A3 | 12/1994 |
| EP | 0 750 291 A1 | 12/1996 |
| EP | 1 450 353 A1 | 8/2004 |
| EP | 1 450 354 A1 | 8/2004 |
| EP | 1 669 983 A1 | 6/2006 |
| JP | 06269084 A2 | 9/1994 |
| JP | 06319193 A | 11/1994 |
| WO | WO 0041169 A1 | 7/2000 |
| WO | WO 0156255 A1 | 8/2001 |
| WO | WO 0173761 A1 | 10/2001 |

OTHER PUBLICATIONS

Chang J.H., et al: "Pitch Estimation of Speech Signal Based on Adaptive Lattice Notch Filter", *Signal Processing*, Elsevier Science Publishers B.V. Amsterdam, NL, vol. 85, No. 3, Mar. 2005, pp. 637-641.

Rabiner L.R., et al: "A Comparative Performance Study of Several Pitch Detection Algorithms", *IEEE Trans. On Acoustics, Speech and Signal Processing*, vol. ASSP-24, No. 5, Oct. 1976, pp. 399-418.

Byun K.J., et al: "Noise Whitening-Based Pitch Detection for Speech Highly Corrupted by Colored Noise", *ETRI Journal*, vol. 25, No. 1, Feb. 2003, pp. 49-51.

Campbell D.A., et al: "Dynamic Weight Leakage for LMS Adaptive Linear Predictors", *Tencon '96 Proceedings*, 1996 IEEE Tencon Digital Signal Processing Applications Perth, WA, Australia Nov. 26-29, 1996, NY, NY, USA, IEEE, US, vol. 2, Nov. 26, 1996, pp. 574-579.

Sasaoka N, et al: "A New Noise Reduction System Based on ALE and Noise Reconstruction Filter", *Circuits and Systems*, 2005. ISCAS 2005. IEEE International Symposium on KOBE, Japan May 23-26, 2005, Piscataway, NJ USA, IEEE May 23, 2005, pp. 272-275.

Learned, R.E. et al., A Wavelet Packet Approach to Transient Signal Classification, Applied and Computational Harmonic Analysis, Jul. 1995, pp, 265-278, vol. 2, No. 3, USA, XP 000972660. ISSN: 1063-5203. abstract.

Quatieri, T.F. et al., Noise Reduction Using a Soft-Decision Sine-Wave Vector Quantizer, International Conference on Acoustics, Speech & Signal Processing, Apr. 3, 1990, pp. 821-824, vol. Conf. 15, IEEE ICASSP, New York, US XP000146895, Abstract, Paragraph 3.1.

Quelavoine, R. et al., Transients Recognition in Underwater Acoustic with Multilayer Neural Networks, Engineering Benefits from Neural Networks, Proceedings of the International Conference EANN 1998, Gibraltar, Jun. 10-12, 1998 pp. 330-333, XP 000974500. 1998, Turku, Finland, Syst. Eng. Assoc., Finland. ISBN: 951-97868-0-5. abstract, p. 30 paragraph 1.

Simon, G., Detection of Harmonic Burst Signals, International Journal Circuit Theory and Applications, Jul. 1985, vol. 13, No. 3, pp. 195-201, UK, XP 000974305. ISSN: 0098-9886. abstract.

Zakarauskas, P., Detection and Localization of Nondeterministic Transients in Time series and Application to Ice-Cracking Sound, Digital Signal Processing, 1993, vol. 3, No. 1, pp. 36-45, Academic Press, Orlando, FL, USA, XP 000361270, ISSN: 1051-2004. entire document.

Kang, Hae-Dong; "Voice Enhancement Using a Single Input Adaptive Noise Elimination Technique Having a Recursive Time-Delay Estimator", Kyungbook National University (Korea), Doctoral Thesis, Dec. 31, 1993, pp. 11-26.

Berk et al., "Data Analysis with Microsoft Excel", Duxbury Press, 1998, pp. 236-239 and 256-259.

Puder, H. et al., "Improved Noise Reduction for Hands-Free Car Phones Utilizing Information on a Vehicle and Engine Speeds", Sep. 4-8, 2000, pp. 1851-1854, vol. 3, XP009030255, 2000. Tampere, Finland, Tampere Univ. Technology, Finland Abstract.

Seely, S., "An Introduction to Engineering Systems", Pergamon Press Inc., 1972, pp. 7-10.

Shust, Michael R. And Rogers, James C., Abstract of "Active Removal of Wind Noise From Outdoor Microphones Using Local Velocity Measurements", *J. Acoust. Soc. Am.*, vol. 104, No. 3, Pt 2, 1998, 1 page.

Shust, Michael R. and Rogers, James C., "Electronic Removal of Outdoor Microphone Wind Noise", obtained from the Internet on Oct. 5, 2006 at: <http://www.acoustics.org/press/136th/mshust.htm>, 6 pages.

Wahab A. et al., "Intelligent Dashboard With Speech Enhancement", Information, Communications, and Signal Processing, 1997. ICICS, Proceedings of 1997 International Conference on Singapore, Sep. 9-12, 1997, New York, NY, USA,EEE, pp. 993-997.

The prosecution history of U.S. Appl. No. 11/102,251 shown in the attached Patent Application Retrieval file wrapper document list, printed Feb. 18, 2009, including any substantive Office Actions and Applicant Responses.

The prosecution history of U.S. Appl. No. 11/101,796 shown in the attached Patent Application Retrieval file wrapper document list, printed Mar. 18, 2009, including any substantive Office Actions and Applicant Responses.

The prosecution history of U.S. Appl. No. 11/317,762 shown in the attached Patent Application Retrieval file wrapper document list, printed Feb. 18, 2009, including any substantive Office Actions and Applicant Responses.

The prosecution history of U.S. Appl. No. 11/298,052 shown in the attached Patent Application Retrieval file wrapper document list, printed Feb. 18, 2009, including any substantive Office Actions and Applicant Responses.

The prosecution history of U.S. Appl. No. 11/757,768 shown in the attached Patent Application Retrieval file wrapper document list, printed Feb. 18, 2009, including any substantive Office Actions and Applicant Responses.

The prosecution history of U.S. Appl. No. 11/849,009 shown in the attached Patent Application Retrieval file wrapper document list, printed Feb. 18, 2009, including any substantive Office Actions and Applicant Responses.

Koike, Shiin'ichi, "Adaptive Threshold Nonlinear Algorithm for Adaptive Filters with Robustness Against Impulse Noise," 1996, IEEE, NEC Corporation, Tokyo 108-01, pp. 1644-1647.

Tam, et al., "Highly Oversampled Subband Adaptive Filters for Noise Cancellation on a Low-resource DSP System," Proc. Of Int. Conf. on Spoken Language Processing (ICSLP), Sep. 2002, pp. 1-4.

Avendano, C., Hermansky, H., "Study on the Dereverberation of Speech Based on Temporal Envelope Filtering," Proc. ICSLP '96, pp. 889-892, Oct. 1996.

Nakatani, T., Miyoshi, M., and Kinoshita, K., "Implementation and Effects of Single Channel Dereverberation Based on the Harmonic Structure of Speech," Proc. of IWAENC-2003, pp. 91-94, Sep. 2003.

Fiori, S., Uncini, A., and Piazza, F., "Blind Deconvolution by Modified Bussgang Algorithm", Dept. of Electronics and Automatics—University of Ancona (Italy), ISCAS 1999.

Vieira, J., "Automatic Estimation of Reverberation Time", Audio Engineering Society, Convention Paper 6107, 116th Convention, May 8-11, 2004, Berlin, Germany, pp. 1-7.

Pornimitkul, Pradya et al., 2102797 Statistic Digital Signal Processing, Comparison of NLMS and RLS For Acoustic Echo cancellation (AEC) and White Gaussian Noise (WGN), Department of Electrical Engineering Faculty of Engineering, 2002, pp. 1-19.

Bilcu, et al., "A New Variable Length LMS Algorithm: Theoretical Analysis and Implementations", 2002 IEEE, pp. 1031-1034.

Nascimento, Vitor H., "Improving the Initial Convergence Of Adaptive Filters" Variable-Length LMS Algorithms, 2002 IEEE, pp. 667-670.

Ismo Kauppinen, "Methods for Detecting Impulsive Noise in Speech and Audio Signals", pp. 967-970, IEEE 2002.

Saeed V. Vaseghi and Peter J.W. Rayner, "The Effects of Non-Stationary Signal Characteristics on the Performance of Adaptive Audio Restoration System", pp. 377-380, IEEE 1989.

\* cited by examiner

PERIODIC SIGNAL ENHANCEMENT SYSTEM

BACKGROUND OF THE INVENTION

1. Technical Field

This invention relates to signal processing systems, and more particularly to a system that may enhance periodic signal components.

2. Related Art

Signal processing systems support many roles. Audio signal processing systems clearly and cleanly capture sound, reproduce sound, and convey sound to other devices. However, audio systems are susceptible to noise sources that can corrupt, mask, or otherwise detrimentally affect signal content.

There are many sources of noise. Wind, rain, background noise such as engine noise, electromagnetic interference, and other noise sources may contribute noise to a signal captured, reproduced, or conveyed to other systems. When the noise level of sound increases, intelligibility decreases.

Some prior systems attempted to minimize noisy signals through multiple microphones. The signals from each microphone are intelligently combined to limit the noise. In some applications, however, multiple microphones cannot be used. Other systems used noise filters to selectively attenuate sound signals. The filters sometimes indiscriminately eliminate or minimize desired signal content as well.

There is a need for a system that enhances signals.

SUMMARY

This invention provides a signal enhancement system that may reinforce signal content and may improve SNR in a signal. The system detects, tracks, and reinforces non-stationary periodic signal components in the signal. The periodic signal components may represent vowel sounds or other voiced sounds. The system also may detect, track, and attenuate quasi-stationary signal components in the signal.

The enhancement system includes a signal input, delay logic, an adaptive filter, and signal reinforcement logic. The adaptive filter may track non-stationary fundamental frequency components in the input signal based on a delayed version of the input signal. The adaptive filter outputs a filtered signal. The filtered signal may approximately resemble the input signal delayed by an integer multiple of the signal's fundamental frequencies. The reinforcement logic combines the input signal and the filtered signal to produce an enhanced signal. A second adaptive filter may be employed to track and suppress quasi-stationary signal components in the input signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

The enhancement system detects and tracks one or more fundamental frequency components in a signal. The signal enhancement system reinforces the tracked frequency components. The enhancement system may improve the intelligibility of information in a speech signal or other audio signals. The reinforced signal may have an improved signal-to-noise ratio (SNR).

Figure 1:
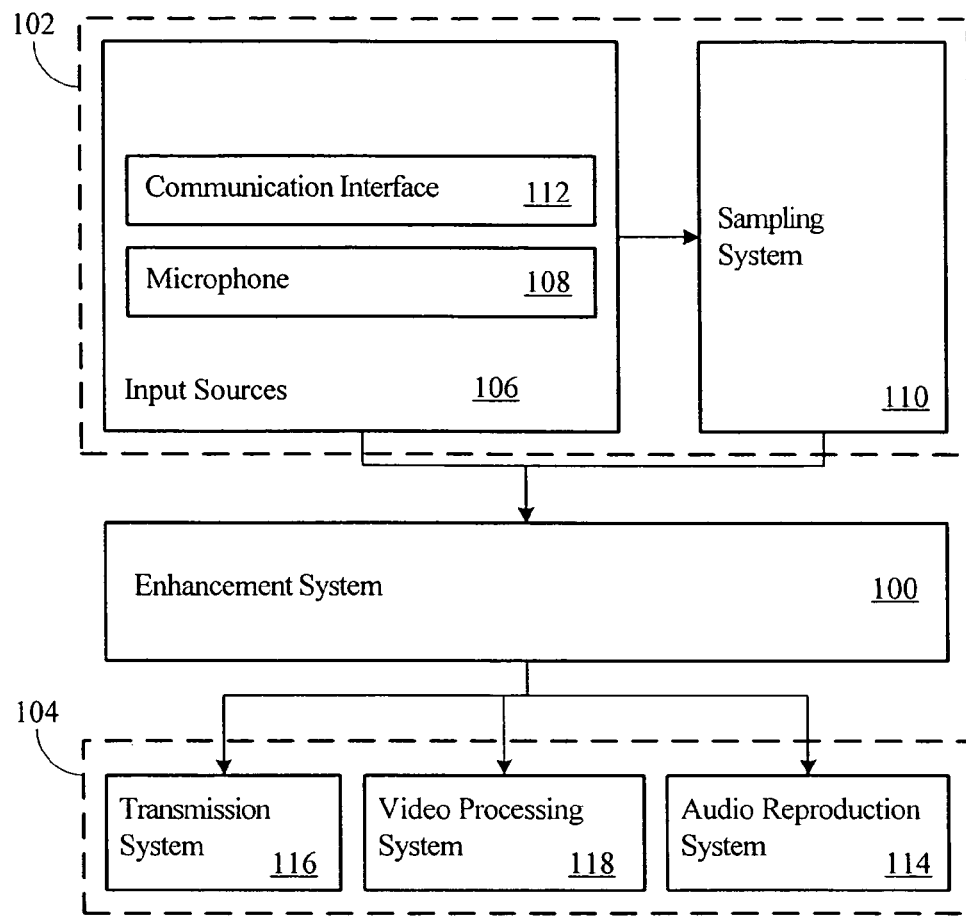
FIG. 1 is a signal enhancement system with preprocessing and post processing logic.

In FIG. 1, a signal enhancement system 100 may operate in conjunction with preprocessing logic 102 and post-processing logic 104. The enhancement system 100 may be implemented in hardware and/or software. The enhancement system 100 may include a digital signal processor (DSP). The DSP may execute instructions that delay an input signal, track frequency components of a signal, filter a signal and/or reinforce spectral content in a signal. Alternatively, the enhancement system 100 may include discrete logic or circuitry, a mix of discrete logic and a processor, or may be distributed over multiple processors or programs.

The enhancement system 100 may accept input from the input sources 106. The input sources 106 may include digital signal sources or analog signal sources such as a microphone 108. The microphone 108 may be connected to the enhancement system 100 through a sampling system 110. The sampling system 110 may convert analog signals sensed by the microphone 108 into digital form at a selected sampling rate.

The sampling rate may be selected to capture any desired frequency content. For speech, the sampling rate may be approximately 8 kHz to about 22 kHz. For music, the sampling rate may be approximately 22 to about 44 kHz. Other sampling rates may be used for speech and/or music.

The digital signal sources may include a communication interface 112, other circuitry or logic in the system in which the enhancement system 100 is implemented, or other signal sources. When the input source is a digital signal source, the enhancement system 100 may accept the digital signal samples with or without additional pre-processing.

The signal enhancement system 100 may also connect to post-processing logic 104. The post-processing logic 104 may include an audio reproduction system 114, digital and/or analog data transmission systems 116, or video processing logic 118. Other post-processing logic also may be used.

The audio reproduction system 114 may include digital to analog converters, filters, amplifiers, and other circuitry or logic. The audio reproduction system 114 may be a speech and/or music reproduction system. The audio reproduction system 114 may be implemented in a cellular phone, car phone, digital media player/recorder, radio, stereo, portable gaming device, or other devices employing sound reproduction.

The video processing system 118 may include circuitry and/or logic that provides a visual output. The signal used to prepare the visual output may be enhanced by the processing performed by the enhancement system 100. The video processing system 118 may control a television or other entertainment device. Alternatively, the video processing system 118 may control a computer monitor or liquid crystal display (LCD).

The transmission system 116 may provide a network connection, digital or analog transmitter, or other transmission circuitry and/or logic. The transmission system 116 may communicate enhanced signals generated by the enhancement system 100 to other devices. In a car phone, for example, the transmission system 116 may communicate enhanced signals from the car phone to a base station or other receiver through a wireless connection such as a ZigBee, Mobile-Fi, Ultrawideband, Wi-fi, or a WiMax network.

Figure 2:
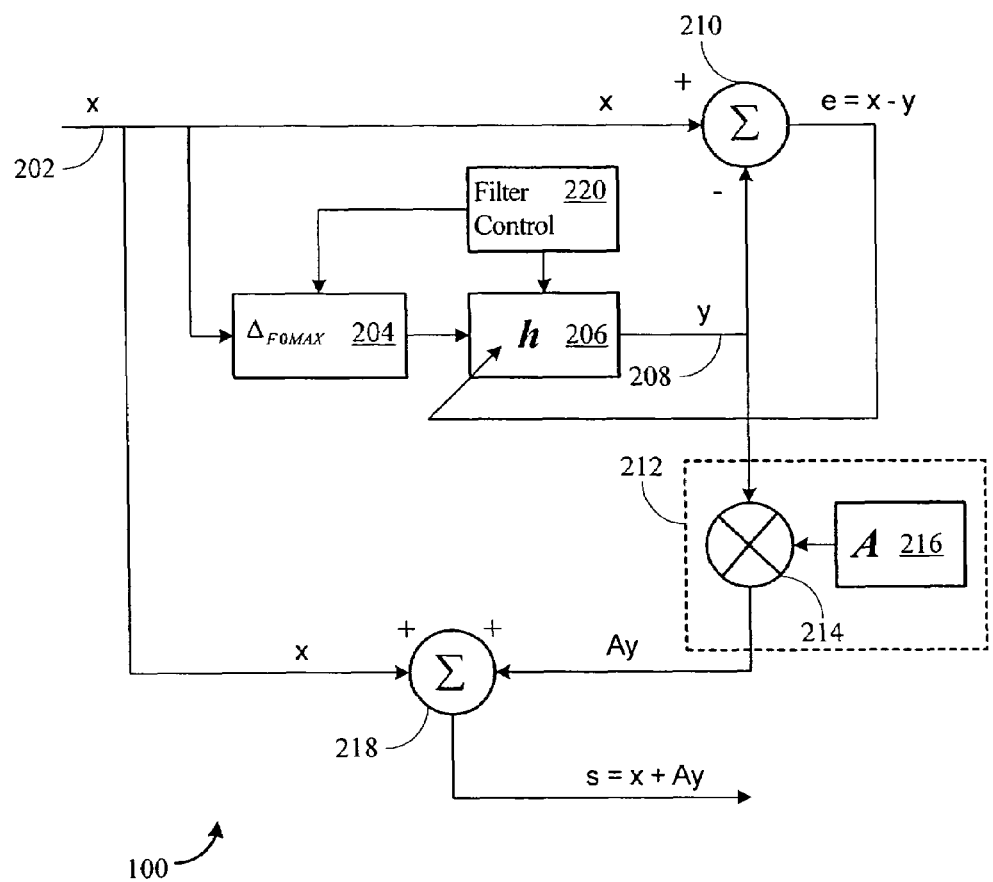
FIG. 2 is a single stage signal enhancement system.

FIG. 2 illustrates the enhancement system 100. The enhancement system 100 includes a signal input 202. The signal input 202 carries an input signal that will be processed by the enhancement system 100. In FIG. 2, the input signal is labeled "x". The input signal may be time domain samples of speech. To facilitate an explanation, speech signals are discussed below. However, the enhancement system 100 may enhance signals with any other range of frequency content, whether audible or inaudible.

The enhancement system 100 may process quasi-stationary or non-stationary signals. Non-stationary signals may vary in their frequency and/or amplitude content relatively quickly over time. Voice is one example of a non-stationary signal.

With few exceptions, even the fundamental frequency component in a speaker's voice changes during speech. The change in fundamental frequency may vary by as much as approximately 50 percent per 100 ms or more. To the human ear, however, the speaker's voice may have a relatively constant pitch.

Quasi-stationary signals change in frequency and/or amplitude less frequently than non-stationary signals. Quasi-stationary signals may arise from machine noise, a controlled human voice, or from other sources. Slowly changing engine noise or alternator whine are examples of quasi-stationary signals.

As shown in FIG. 2, the input signal is coupled to delay logic 204. The delay logic 204 imparts a delay to the input signal. The delay may vary widely depending on the particular implementation of the enhancement system 100. The delay may correspond to a period of a selected maximum pitch. The maximum pitch may be equal to the greatest pitch in the input signal that the enhancement system 100 enhances. The maximum pitch may vary widely depending on the type and characteristics of the input signal.

Speech signals may include a fundamental frequency component from approximately 70 Hz to about 400 Hz. Male speech often includes a fundamental frequency component between approximately 70 Hz to about 200 Hz. Female speech often includes a fundamental frequency component between approximately 200 Hz to about 400 Hz. A child's speech often includes a fundamental frequency component between approximately 250 Hz to about 400 Hz.

The enhancement system 100 may process input signals that include speech from both male and female voices, either separately or simultaneously and overlapping. In these systems, the maximum pitch period may approximately correspond to the period of the fundamental frequency of the female voice. The maximum pitch period may be approximately about 1/300 Hz (approximately 3.3 ms), or may be another pitch period associated with female voice.

Alternatively, the enhancement system 100 may processes speech only from males. In these implementations, the maximum pitch period may correspond to the period of the fundamental frequency of male voice. The maximum pitch period may be approximately 1/150 Hz (approximately 6.6 ms), or may be another pitch period.

The delay logic 204 may delay the input signal by the number of signal samples corresponding to the maximum pitch period. The number of signal samples may be given by:

$$NSS = MPP * f_s$$

where 'NSS' is the number of signal samples, 'MPP' is the maximum pitch period and 'fs' is the sampling rate. Assuming an MPP of about 3.3 ms and a sampling rate of about 8 kHz, NSS=approximately 27 samples. In FIG. 2, NSS corresponds to $\Delta_{F0MAX}$.

The delayed input signal may be received by the filter 206. The filter 206 includes a filter output 208 that carries a filtered output signal, labeled 'y' in FIG. 2. The filter 206 may track one or more frequency components in the input signal based on the delayed input signal. The filter 206 may track the fundamental frequencies in the input signal as the pitch changes during voiced speech.

The filter 206 may reproduce, replicate, approximate or otherwise include the tracked frequency content in the filtered output signal. The filter 206 may be a Finite Impulse Response Filter (FIR) or other type of digital filter. The coefficients of filter 206 may be adaptive. The filter 206 may be adapted by a Normalized Least Mean Squares (NLMS) technique or other type of adaptive filtering technique such as Recursive Least Squares (RLS) or Proportional LMS. Other tracking logic, including other filters may also be used.

The filter 206 may converge to the fundamental frequency in the input signal. The range of fundamental frequencies $f_0$ over which the filter 206 converges may be given by:

$$f_o = f_{0MAX} - f_{0MIN}$$

$$f_{0MAX} = \frac{f_s}{\Delta_{F0MAX}}$$

$$f_{0MIN} = \frac{f_s}{\Delta_{F0MAX} + L}$$

where $\Delta_{F0MAX}$ is the period for the maximum pitch (expressed in terms of samples), $f_s$ is the sampling frequency (in units of Hz), and L is the length of the filter 206 (in units of samples). The filter length L may increase or decrease to increase or decrease the frequency extent over which the filter 206 tracks frequency components.

In the example above, the maximum pitch was approximately 300 Hz and the delay logic 204 implemented a 27 sample delay. A filter length L of 64 samples yields a filter 206 that tracks fundamental frequency content over a frequency range of approximately 88 Hz to about 296 Hz:

$$f_{0MAX} = \frac{8000}{27} \approx 296$$

$$f_{0MIN} = \frac{8000}{27 + 64} \approx 88$$

$$f_o \approx 296 - 88 = 208 \text{ Hz}$$

The filter 206 may adapt over time. The filter 206 may quickly adapt by evaluating an error signal 'e' on a sample-by-sample basis. Alternatively, the filter 206 may adapt based on blocks of samples, or other another basis.

In adapting, the filter 206 may change one or more of its filter coefficients. The filter coefficients may change the response of the filter 206. The filter coefficients may adapt the filter 206 so that the filter 206 attempts to minimize the error signal 'e'.

The error estimator 210 may generate the error signal 'e'. The error estimator 210 may be an adder, comparator, or other circuitry or logic. The error estimator 210 may compare the input signal 'x' with the filtered output signal 'y'.

As the filter 206 converges to the fundamental frequency in the input signal, the error signal decreases. As the error signal decreases, the filtered output signal 'y' more closely resembles the input signal 'x' delayed by an integer multiple of the signal's fundamental frequencies. The gain control logic 212 may respond to the error signal.

The optional gain control logic 212 may include a multiplier 214 and a gain parameter 216. The gain control logic 212 may attenuate, amplify, or otherwise modify the filtered output signal. FIG. 2 shows that the gain control logic 212 applies a gain, 'A', to the filtered output signal to produce the gain controlled signal 'Ay'.

The reinforcement logic 218 may reinforce frequency content in the input signal 'x' with the gain controlled signal 'Ay'. The reinforcement logic 218 may be an adder or other circuitry and/or logic. The reinforcement logic 218 may produce the enhanced output signal:

$$s = x + Ay$$

When the error signal increases, the gain control logic 212 may reduce the gain, 'A'. When the gain is reduced, the filtered output signal may contribute less to the enhanced output signal. The relationship between the error signal and the gain may be continuous, stepped, linear, or non-linear.

In one implementation, the enhancement system 100 establishes one or more error thresholds. As the error signal exceeds an upper threshold, the gain control logic 212 may reduce the gain 'A' to 0 (zero). The upper threshold may be set to the input signal so that if e>x, then the gain 'A' may be set to zero. As the error signal falls below a lower threshold, the gain control logic 212 may increase the gain 'A' to 1 (one).

When the error signal exceeds the upper threshold, the filter control logic 220 may reset the filter 206. When the filter 206 is reset, the control logic 220 may zero-out the filter coefficients, re-initialize the filter coefficients, or may take other actions. The control logic 220 may also dynamically modify the filter length, may modify the delay implemented by the delay logic 204, or may modify other characteristics of the enhancement system 100. The control logic 220 also may modify the enhancement system 100 to adapt to changing environments in which the enhancement system 100 is used, to adapt the enhancement system 100 to a new speaker, or other applications.

The filter control logic 220 also may control how quickly the filter 206 adapts, whether the filter adapts, or may monitor or control other filter characteristics. In the context of a system that enhances non-stationary signals, the control logic 220 may expect quickly changing frequency and amplitude components in the input signal. The control logic 220 may also expect or determine over time that particular frequency components in the input signal are prevalent.

The control logic 220 also may determine that the input signal has changed in frequency content, amplitude, or other characteristics from what is expected or from what has been determined. In response, the control logic 220 may stop the filter 206 from attempting to adapt to the new signal content, may slow the rate of adaptation, or may take other actions. The control logic 220 may exercise control over the filter 206 until the input signal characteristics return to what is expected, until a predetermined time has elapse, until instructed to release control, or until another time or condition is met.

The delay logic 204 prevents the filtered output signal from precisely duplicating the current input signal 'x'. Thus, the filtered output signal may closely track the selected periodicities in the input signal 'x'. When the current input signal 'x' is reinforced by the filtered output signal 'y' to produce the output signal 's', periodic signal components may combine constructively and random noise components may combine destructively. Therefore, the periodic signal components may be enhanced more than the noise.

The delay introduced by the delay logic 204 and the filter 206 may be approximately one cycle of a fundamental frequency component tracked by the filter 206. The delay may correspond to the glottal pulse delay for voice sounds, such as vowels. When the filtered output signal is added to the input signal, the delay may allow the fundamental frequency components to add in-phase or approximately in-phase.

When added in-phase, Then resulting gain in the fundamental frequency content in the enhanced output signal may be approximately 6 dB or more. The noise in the input signal and the filtered output signal tends to be out of phase. When the input signal and the filtered output signal are added, the noise may increase less than the enhanced frequency content, for example by 3 dB or less. The enhanced output signal may have increased SNR.

The input signal that the enhancement system 100 processes may include multiple fundamental frequencies. For example, when two speakers are speaking at the same time, the input signal may include two non-stationary fundamental frequencies. When multiple fundamental frequencies are present, the filter 206 continues to adapt and converge to provide a filtered out signal 'y' that is a delayed version of the input signal. The reinforcement logic 218 may reinforce one or more of the fundamental frequencies present in the input signal.

Figure 3:
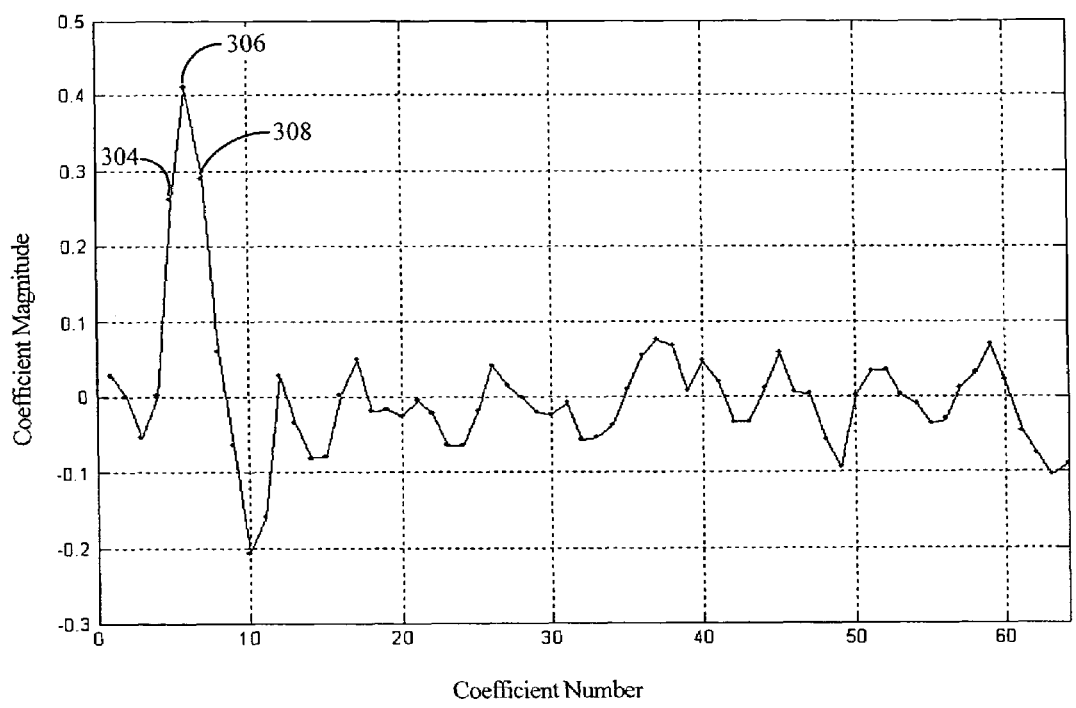
FIG. 3 is a plot of filter coefficients in a filter adapted to a female voice.

In FIG. 3, a plot illustrates coefficients 300 for the filter 206. The coefficients are plotted by coefficient number on the horizontal axis and magnitude on the vertical axis. The coefficients 300 show the filter 206 as it has adapted to female speech.

At any instance in time, the coefficients 300 may be analyzed to determine a fast estimate of the fundamental frequencies in the input signal. with good temporal resolution. The coefficients 300 begin to peak around coefficient 304 (the fifth filter coefficient), coefficient 306 (the sixth filter coefficient), and coefficient 308 (the seventh filter coefficient). By searching for a coefficient peak or an approximate coefficient peak, and determining a corresponding coefficient index, 'c', a fast approximation of the fundamental frequency, $f_a$, may be made:

$$f_a = \frac{f_s}{(c + \Delta_{F0MAX})}$$

In FIG. 3, the coefficient peak is at the sixth filter coefficient 306. Assuming an 8 kHz sampling rate and a 27 sample delay:

$$f_a = \frac{f_s}{(c + \Delta_{F0MAX})} = \frac{8000}{6 + 27} \approx 242 \text{ Hz}$$

Figure 4:
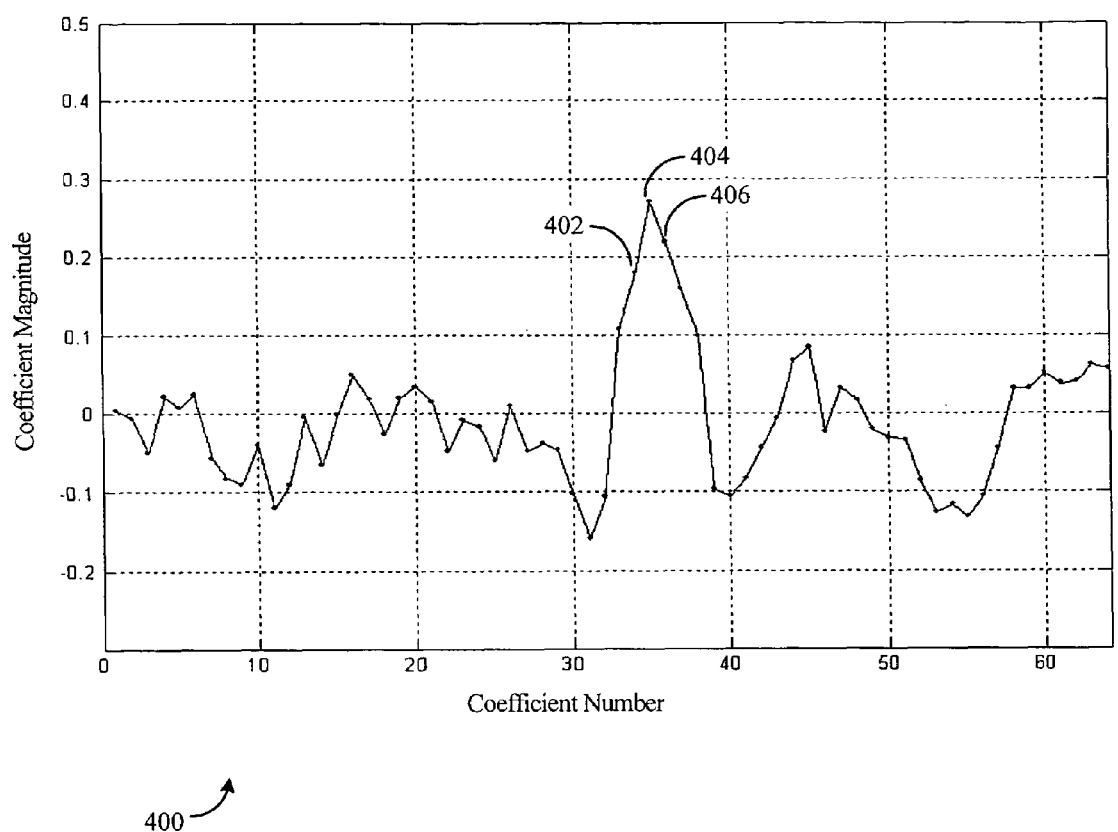
FIG. 4 is a plot of filter coefficients in a filter adapted to a male voice.

In FIG. 4, a plot shows coefficients 400 for the filter 206 as it has adapted to male speech. The coefficient peak appears near coefficient 402 (the 34th filter coefficient), coefficient 404 (the 35th filter coefficient), and coefficient 406 (the 36th filter coefficient). An approximation to the fundamental frequency is:

$$f_a = \frac{f_s}{(c + \Delta_{F0MAX})} = \frac{8000}{35 + 27} \approx 129 \text{ Hz}$$

The control logic 220 may store historical data on many characteristics of the input signal, including the fundamental frequency of the input signal as it changes over time. The control logic 220 may examine the historical data as an aid in determining whether the characteristics of the input signal have unexpectedly changed. The control logic 220 may respond by exercising adaptation control over the filter 206 or by taking other actions.

Figure 5:
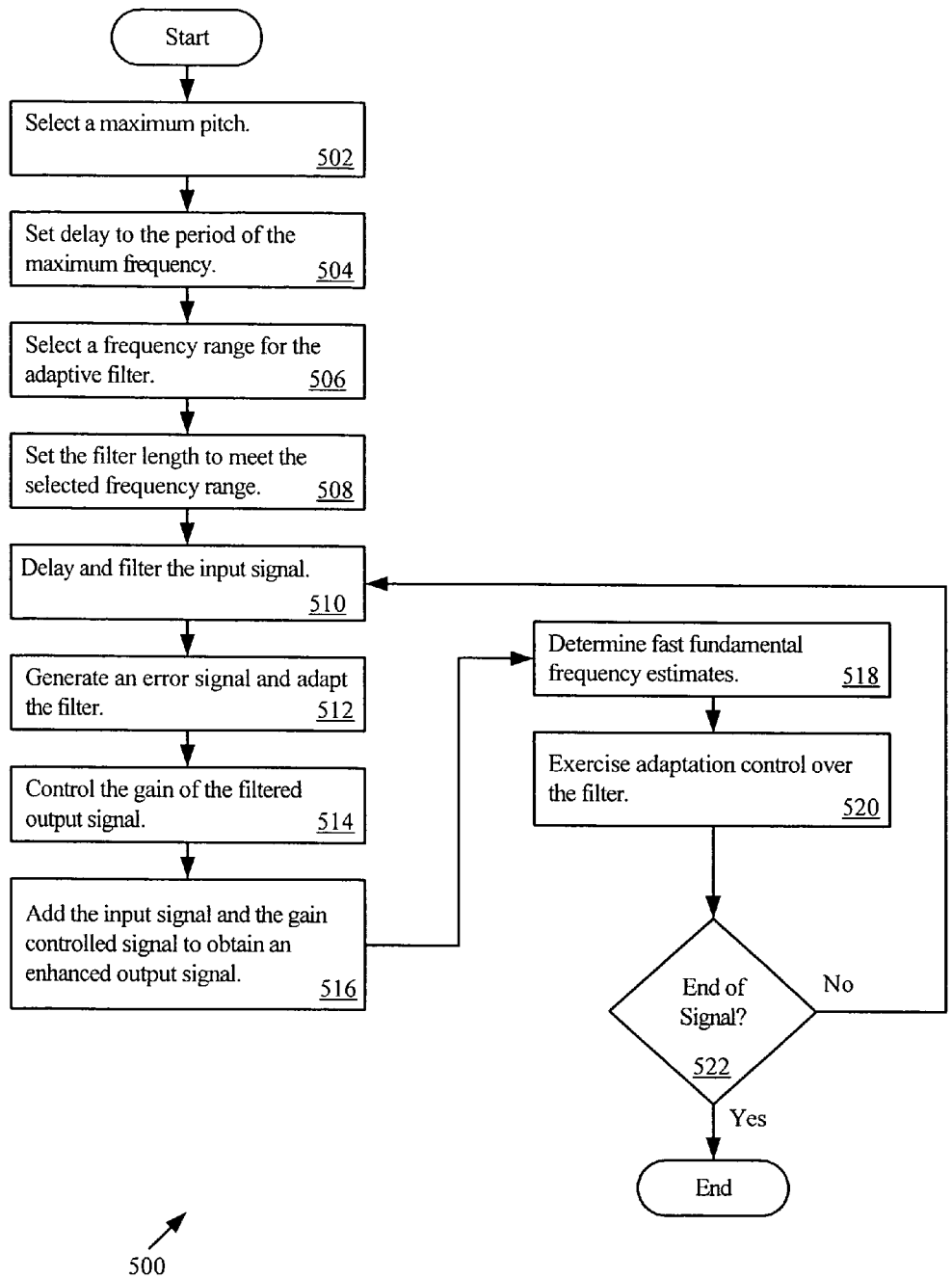
FIG. 5 is a flow diagram of signal enhancement.

FIG. 5 shows a flow diagram of acts that may be taken to enhance a periodic signal. A maximum pitch is selected for processing by the enhancement system 100 (Act 502). The delay logic 204 may be set to implement the period of the maximum pitch (Act 504).

A frequency range over which the enhancement system 100 will operate may also be selected (Act 506). The filter length of the filter 206 may be set to accommodate the frequency range (Act 508). The filter length may be dynamically changed during filter 206 operation.

The input signal is delayed and filtered (Act 510). The enhancement system 100 may generate an error signal and responsively adapt the filter 206 (Act 512). The enhancement system 100 may control the gain of the filtered output signal (Act 514).

The enhancement system 100 may add the input signal and the gain controlled signal (Act 516). An enhanced output signal may result. The enhancement system 100 also may determine fundamental frequency estimates (Act 518). The enhancement system 100 may employ the frequency estimates to exercise adaptation control over the filter 206 (Act 520).

Figure 6:
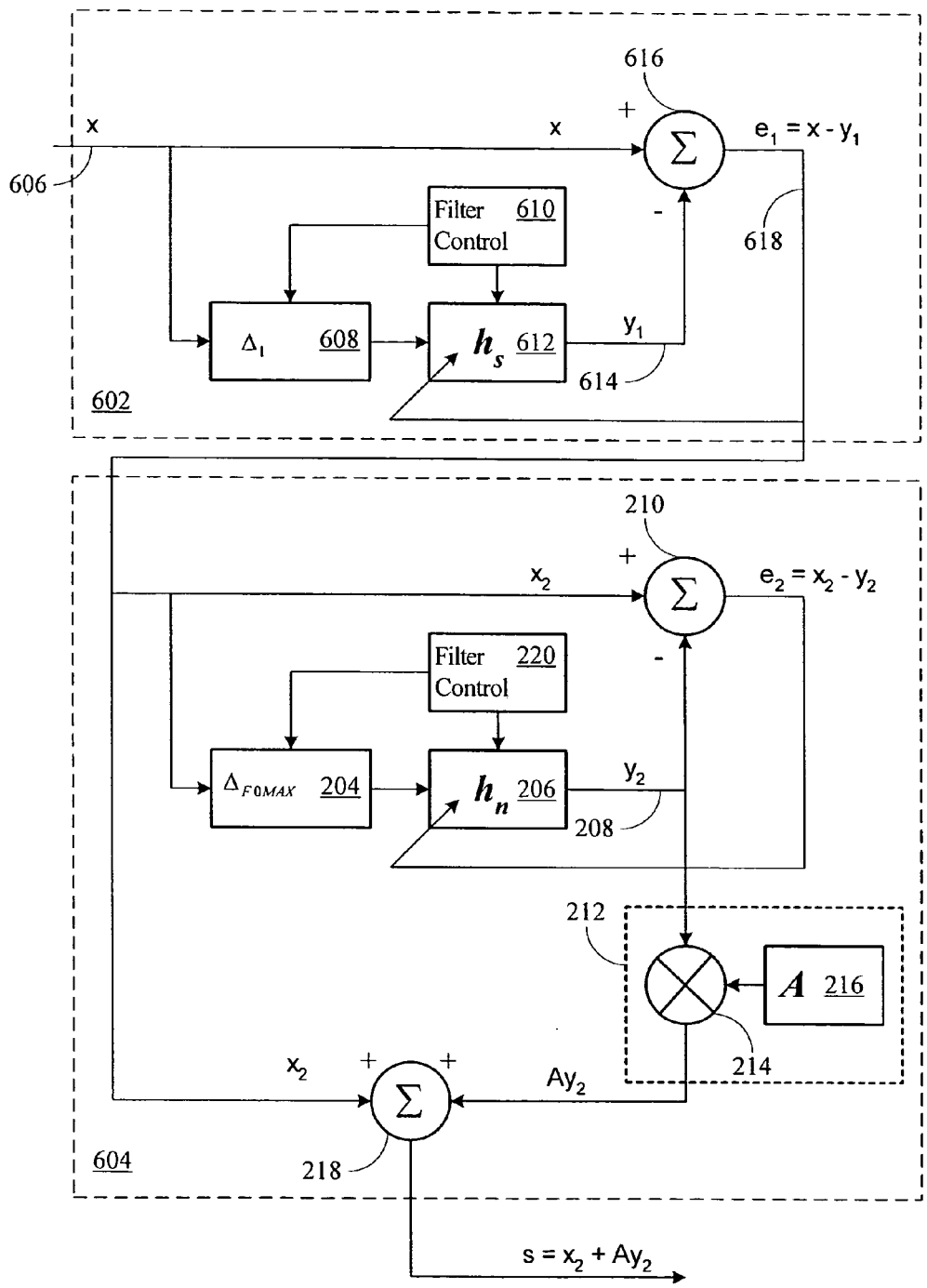
FIG. 6 is a multiple stage signal enhancement system.

FIG. 6 shows a multiple stage enhancement system 600. The enhancement system 600 includes a first filter stage 602 and a second filter stage 604. The filter stages 602 and 604 may respond or adapt at different rates.

The first filter stage 602 may adapt slowly and may suppress quasi-stationary signal components. The quasi-stationary signal components may be present in the input signal because of relatively consistent background noise, such as engine noise or environmental effects, or for other reasons.

A signal input 606 connects to the first stage 602. The signal input 606 may connect to the delay logic 608. The delay logic may implement a delay that corresponds to the period of a maximum quasi-stationary frequency that may be suppressed by the first stage 602.

The maximum quasi-stationary frequency may be selected according to known or expected characteristics of the environment in which the enhancement system 600 is used. The filter control logic 610 may dynamically modify the delay to adapt the first stage 602 to the environment. The filter control logic 610 also may control the quasi-stationary filter 612.

The filter 612 in the first stage may include signal component tracking logic such as a NLMS adapted FIR filter or RLS adapted FIR filter. The filter 612 in the first stage may adapt slowly, for example with a sampling rate of 8 kHz and a filter length of 64 an NLMS step size larger than 0 and less than approximately 0.01 may allow attenuation of quasi-stationary periodic signals while minimally degrading typical speech signals. The first stage filtered output 614 may provide a filtered output signal that approximately reproduces the quasi-stationary signal component in the input signal.

The suppression logic 616 and slow filter adaptation may allow non-stationary signal components to pass through the first stage 602 to the second stage 604. On the other hand, the suppression logic 616 may suppress quasi-stationary signal components in the input signal. The suppression logic 616 may be implemented as arithmetic logic that subtracts the filtered output signal from the input signal.

The replicated quasi-stationary signal content in the filtered output signal is removed from the input signal. The output signal produced by the first stage 602 may be:

$$x_2 = e_1 = x - y_1$$

where '$e_1$' is the first stage output signal, 'x' is the input signal, and '$y_1$' is the first stage filtered output.

The first stage output 618 may be connected to the second stage 604. The second stage 604 may process the signal '$x_2$' with the adaptive filter 206. The filter 206 may adapt quickly, for example with a sampling rate of 8 kHz and a filter length of 64 an NLMS step size larger than approximately 0.6 and less than 1.0 may allow the adaptive filter 206 to track the fundamental frequencies in typical speech signals.

The second stage 604 may enhance non-stationary signal components in the first stage output signal. The non-stationary signal components may be present in the input signal as a result of speech, music, or other signal sources. The second stage 604 may process the first stage output signal as described above.

The enhancement system 600 employs a first suppression stage 602 followed by a second enhancement stage 604. The enhancement system 600 may be employed to reinforce non-stationary signal content, such as voice content. In environments that introduce slowly changing signal components, the enhancement system 600 may remove or suppress the slowly changing signal components. In a car phone, for example, the first stage 602 may remove or suppress engine noise, road noise, or other noises, while the second stage 604 enhances non-stationary signal components, such as male or female voice components.

The signal enhancement system 100 may enhance periodic signal content, increase SNR, and/or decrease noise in an input signal. When applied to a voice signal, the enhancement system 100 may reinforce fundamental speech frequencies and may strengthen vowel or other sounds. The enhancement system 100 may enhance other signals, whether they are audible or inaudible.

The overall delay introduced by the delay logic 204 or 608 and the filter 206 or 612 also may be approximately an integer number (one or greater) of cycles of the tracked pitch period. Delaying by additional cycles may allow the input signal to change to a greater degree than waiting one cycle. Adding the longer delayed filtered signal to the current input signal may produce special effects in the output signal such as reverberation, while still enhancing fundamental frequency components.

The signal enhancement systems 200 and 600 may be implemented in hardware, software, or a combination of hardware and software. The enhancement systems 200 and 600 may take the form of instructions stored on a machine readable medium such as a disk, flash card, or other memory. The enhancement systems 200 and 600 may be incorporated into communication devices, sound systems, gaming devices, signal processing software, or other devices and programs.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A signal enhancement system comprising:
a signal input;
delay logic coupled to the signal input;
an adaptive filter coupled to the delay logic; and
reinforcement logic implemented in hardware or executed by a processor, where the reinforcement logic is coupled to the adaptive filter and the signal input to add an output of the adaptive filter to an input signal received on the signal input to increase a first periodic signal component in the input signal that is at least partially in-phase with a second periodic signal component in the output of the adaptive filter.

2. The system of claim 1, where the delay logic and adaptive filter implement a glottal pulse delay for voiced sounds.

3. The system of claim 1, where the adaptive filter is a sample-by-sample adaptive filter.

4. The system of claim 1, further comprising gain control logic coupled to the filter.

5. The system of claim 4, where the gain control logic is coupled to the filter and the signal reinforcement logic.

6. The system of claim 1, further comprising an error estimator coupled to the filter and the signal input;
where the adaptive filter is responsive to reduce an error signal that comprises a difference between the input signal and the output of the adaptive filter.

7. The system of claim 1, further comprising:
an error estimator coupled to the filter and the signal input;
gain control logic coupled to the output of the filter and being responsive to the error estimator.

8. The system of claim 1, where the delay logic implements a delay corresponding to a period of a maximum pitch to be enhanced.

9. The system of claim 8, where the maximum pitch comprises a selected maximum voice pitch.

10. The system of claim 8, where the maximum pitch is between approximately 70 Hz and about 400 Hz.

11. The system of claim 8, where the maximum pitch is a female voice maximum pitch.

12. The system of claim 8, where the maximum pitch is a male voice maximum pitch.

13. The system of claim 8, where the filter comprises a length L filter, where L extends the filter over a selected enhancement frequency range.

14. The system of claim 13, where the enhancement frequency range comprises an audible voice frequency band.

15. The system of claim 1, where the signal input is coupled to a slowly adapting signal filter output.

16. The system of claim 1, where the signal input is coupled to a first stage signal filter comprising quasi-stationary frequency tracking and attenuation logic.

17. The system of claim 1, where the reinforcement logic is configured to add the output of the adaptive filter to the input signal to decrease a first non-periodic signal component in the input signal that is at least partially out of phase with a second non-periodic signal component in the output of the adaptive filter.

18. The system of claim 1, where the reinforcement logic is configured to add the output of the adaptive filter to the input signal to constructively combine one or more periodic signal components of the input signal with one or more periodic signal components of the output of the adaptive filter; and
where the reinforcement logic is configured to add the output of the adaptive filter to the input signal to destructively combine one or more noise components of the input signal with one or more noise components of the output of the adaptive filter.

19. A signal enhancement system comprising:
a signal input;
means for delaying an input signal received through the signal input;
means for adaptively filtering the delayed signal to obtain a filtered output signal; and
means for reinforcing the input signal with the filtered output signal by adding the filtered output signal to the input signal to increase a first periodic signal component in the input signal that is at least partially in-phase with a second periodic signal component in the filtered output signal, where the means for reinforcing is implemented in hardware or executed by a processor.

20. The system of claim 19, further comprising:
means for estimating an error between the filtered output signal and the input signal;
where the means for adaptively filtering is responsive to reduce the error.

21. The system of claim 19, further comprising:
means for controlling gain of the filtered output signal.

22. The system of claim 20, further comprising:
means for controlling gain of the filtered output signal that is responsive to the means for estimating error.

23. The system of claim 19, further comprising means for filtering a quasi-stationary signal coupled to the signal input.

24. The system of claim 19, where the means for reinforcing is configured to add the filtered output signal to the input signal to constructively combine one or more periodic signal components of the input signal with one or more periodic signal components of the filtered output signal; and
where the means for reinforcing adds the filtered output signal to the input signal to destructively combine one or more noise components of the input signal with one or more noise components of the filtered output signal.

25. A method for enhancing a signal, comprising:
receiving an input signal; delaying the input signal to obtain a delayed signal; applying an adaptive filter to the delayed signal to obtain a filtered output signal, where the adaptive filter is implemented in hardware or executed by a processor; and reinforcing the input signal with the filtered output signal by adding the filtered output signal to the input signal to increase a first periodic signal component in the input signal that is at least partially in-phase with a second periodic signal component in the filtered output signal.

26. The method of claim 25, further comprising:
adapting the filter using a Normalized Least Means Squares technique.

27. The method of claim 25, further comprising:
determining an error between the output of the adaptive filter and the input signal.

28. The method of claim 27, further comprising:
adapting filter coefficients of the adaptive filter based on the error.

29. The method of claim 27, further comprising:
adjusting gain applied to the output of the adaptive filter based on the error.

30. The method of claim 25 further comprising:
estimating a fundamental frequency of the input signal.

31. The method of claim 30, where the fundamental frequency occurs in a voice frequency band.

32. The method of claim 30, where the fundamental frequency is less than approximately 400 Hz.

33. The method of claim 30, where the fundamental frequency is less than approximately 200 Hz.

34. A product comprising:
a machine readable medium; and
machine readable instructions embodied on the machine readable medium that:
 delay an input signal to obtain a delayed signal;
 apply an adaptive filter to the delayed signal to obtain a filtered output signal; and
 reinforce the input signal with the filtered output signal by adding the filtered output signal to the input signal to increase a first periodic signal component in the input signal that is at least partially in-phase with a second periodic signal component in the filtered output signal.

35. The product of claim 34, further comprising:
adaptive filtering instructions that estimate a fundamental frequency component of the input signal.

36. The product of claim 34, further comprising:
Normalized Least Means Squares adaptive filtering instructions.

37. The product of claim 35, where the fundamental frequency occurs in a voice frequency band.

38. The product of claim 34, further comprising instructions that:
dynamically change a filter length.

39. The product of claim 34, further comprising instructions that:
dynamically change an input signal delay.

40. The product of claim 34, further comprising instructions that:
prevent adaptation of the adaptive filter based on an expected input signal characteristic.

41. The product of claim 34, further comprising instructions that:
determine an error between the output of the adaptive filter and the input signal.

42. The product of claim 41, further comprising instructions that:
adjust gain applied to the output of the adaptive filter based on the error.

43. The product of claim 34, further comprising instructions that:
track and attenuate a quasi-stationary signal component in the input signal.

* * * * *